United States Patent

Mullen, III et al.

[11] Patent Number: 6,060,817
[45] Date of Patent: May 9, 2000

[54] SWITCHING METHOD USING A FREQUENCY DOMAIN PIEZOELECTRIC SWITCH

[75] Inventors: William Boone Mullen, III, Boca Raton; Andrzej T. Guzik; Rudy Yorio, both of Pompano Beach; Adolph C. Naujoks, Hallandale, all of Fla.

[73] Assignee: Motorola, Inc., Schaumburg, Ill.

[21] Appl. No.: 09/055,426

[22] Filed: Apr. 6, 1998

[51] Int. Cl.⁷ .................................................... H01L 41/08
[52] U.S. Cl. ........................ 310/339; 310/311; 310/319; 310/331
[58] Field of Search ..................... 310/311, 319, 310/329, 330, 331, 359, 339

[56] References Cited

U.S. PATENT DOCUMENTS

| | | | |
|---|---|---|---|
| 4,639,631 | 1/1987 | Chason et al. | 310/344 |
| 4,697,118 | 9/1987 | Harnden et al. | 310/331 |
| 4,742,263 | 5/1988 | Harnden et al. | 310/331 |
| 4,853,580 | 8/1989 | Sula | 310/339 |
| 5,034,648 | 7/1991 | Gastgeb | 310/330 |
| 5,406,682 | 4/1995 | Zimnicki et al. | 29/25.35 |
| 5,977,690 | 11/1999 | Ellis et al. | 310/330 |

*Primary Examiner*—Thomas M. Dougherty
*Attorney, Agent, or Firm*—Dale W. Dorinski

[57] ABSTRACT

A frequency domain switch (100) utilizes an array of cantilevered beams (108) laminated with a piezoelectric material (126). Each of the beams has a unique geometry, and produces a sinusoidal electrical signal in the piezoelectric film that is assignable only to one of the cantilevered beams. When a free end of one of the cantilevered beams is deflected, it produces a signal that is analyzed by suitable circuitry (410–440) to read the position of the switch.

11 Claims, 4 Drawing Sheets

SWITCHING METHOD USING A FREQUENCY DOMAIN PIEZOELECTRIC SWITCH

CROSS REFERENCE TO RELATED APPLICATIONS

This application is related to U.S. application Ser. No. 08/917,588 filed Aug. 25, 1997, by Guzik, et al., entitled "Piezoelectric Switch for a Communication Device," and to U.S. application Ser. No. 08/917,587 filed Aug. 25, 1997, by Ellis, et al., entitled "Piezoelectric Switch Apparatus for a Communication Device," and assigned to Motorola, Inc.

TECHNICAL FIELD

This invention relates in general to communication devices and more particularly to frequency domain switches, such as channel selectors and volume frequency domain switches, used in communication devices.

BACKGROUND

Mobile and portable radio products have utilized a variety of switch mechanisms to control certain radio functions, such as volume control, on-off, and channel selection. Conventional switch mechanisms include electro-mechanical switches, rotary resistive elements, and/or mechanically encoded rotary switches. Unfortunately, many of the electromechanical types of switches have limited reliability due to contact wear and contact contamination as well as problems associated with poor synchronization between electrical contact and tactile feedback. The rotary type switches have proven to be only marginally reliable and often require interconnection to the internal radio circuitry via expensive flex circuits and connectors.

Accordingly, there is a need for an improved frequency domain switch apparatus for use in radio products.

DETAILED DESCRIPTION OF THE PREFERRED EMBODIMENT

The method of switching using a frequency domain switch to be described herein utilizes the electrical output of a piezoelectric film to provide a unique switching signal. While the preferred embodiment will be described in terms of a frequency domain switch operating as a channel selector for a two-way radio, one skilled in the art realizes that the present invention extends to many other control applications, such as volume control or on/off control for all sorts of electronic devices. Our piezoelectric frequency domain switch resolves the stated problems of cost and reliability associated with prior art switches.

Figure 2:
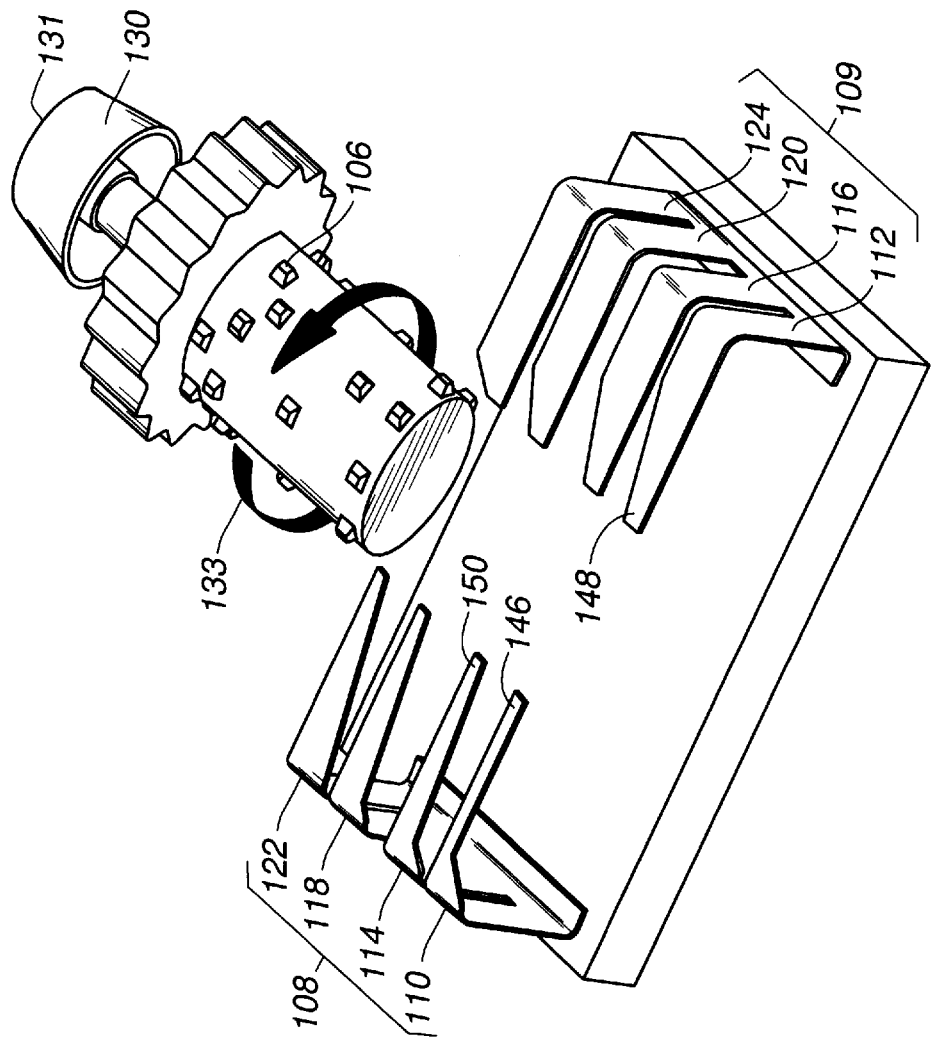
FIG. 2 shows an exploded view of the apparatus of FIG. 1.
Figure 1:
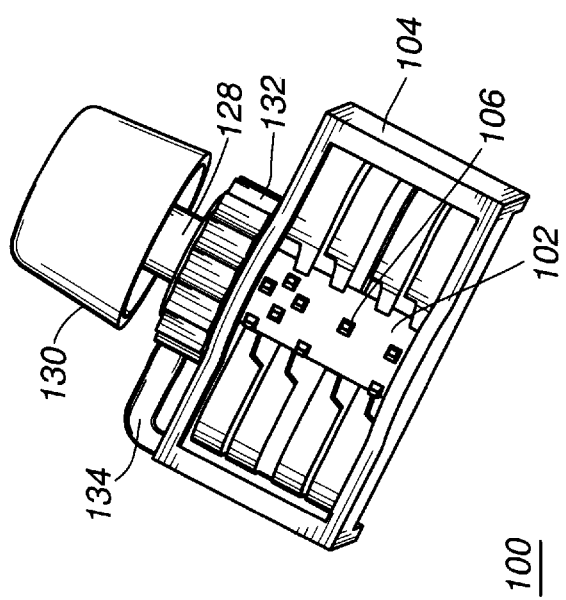
FIG. 1 shows an assembled view of the mechanical portion of a frequency domain switch in accordance with the present invention.
Figure 4:
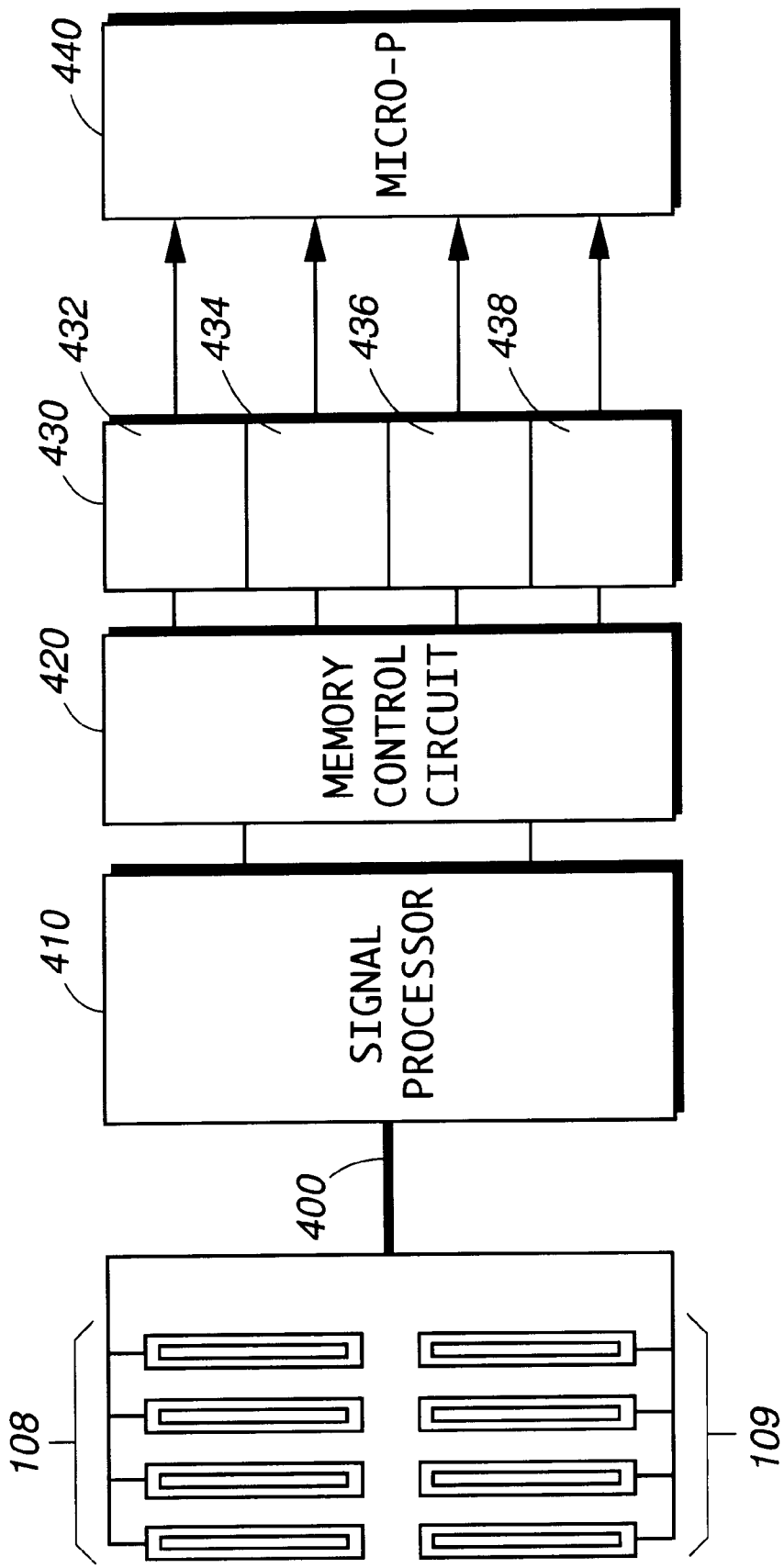
FIG. 4 shows a schematic of a memory circuit for use with the frequency domain switch.

The frequency domain switch of the present invention is comprised of both a mechanical section, one embodiment of which is shown in FIG. 1, and an electrical section, one embodiment of which is shown in FIG. 4. Referring now to FIGS. 1 and 2, one embodiment of the frequency domain switch 100 comprises a cylindrical drum 102 mounted in a switch housing 104. The drum 102 includes strategically positioned protrusions 106 to actuate two arrays 108, 109 of cantilevered beams 110–124 secured within the switch housing 104. For the preferred embodiment of the invention, the protrusions 106 are positioned to provide for a binary encoded contact formation. Each of the cantilevered beams 110–124 are laminated with piezoelectric film 126 for generating an electric pulse when mechanically excited. The cylindrical drum 102 is assembled to a shaft 128 and to a knob 130. The shaft 128 includes evenly spaced gear teeth 132 which provide a predetermined number of detents for one revolution of the knob 130. Housing 104 preferably includes a cantilevered beam 134 extending therefrom which catches within the gear teeth 132 for each detent. For purposes of this example, gear teeth 132 are spaced to provide for sixteen detents which correspond to sixteen channel positions, but may have any number of positions as desired by the designer.

Each array 108, 109 of cantilevered beams 110–124 is preferably formed from a single sheet metal part as shown in FIG. 2. The sheet metal can be cut, folded, and formed to provide, for example, pairs of opposing cantilevered beams, (110, 112), (114, 116), (118, 120), (122, 124), however, any number of other configurations can be incorporated to provide deflection of the cantilever beams. A piezoelectric film 126 is laminated onto each of the cantilevered beams 110–124 and appropriately polarized. Each cantilevered beam 110–124 is then metallized to provide electrodes for accumulating electrical charges during mechanical excitation of the beams.

Figure 3:
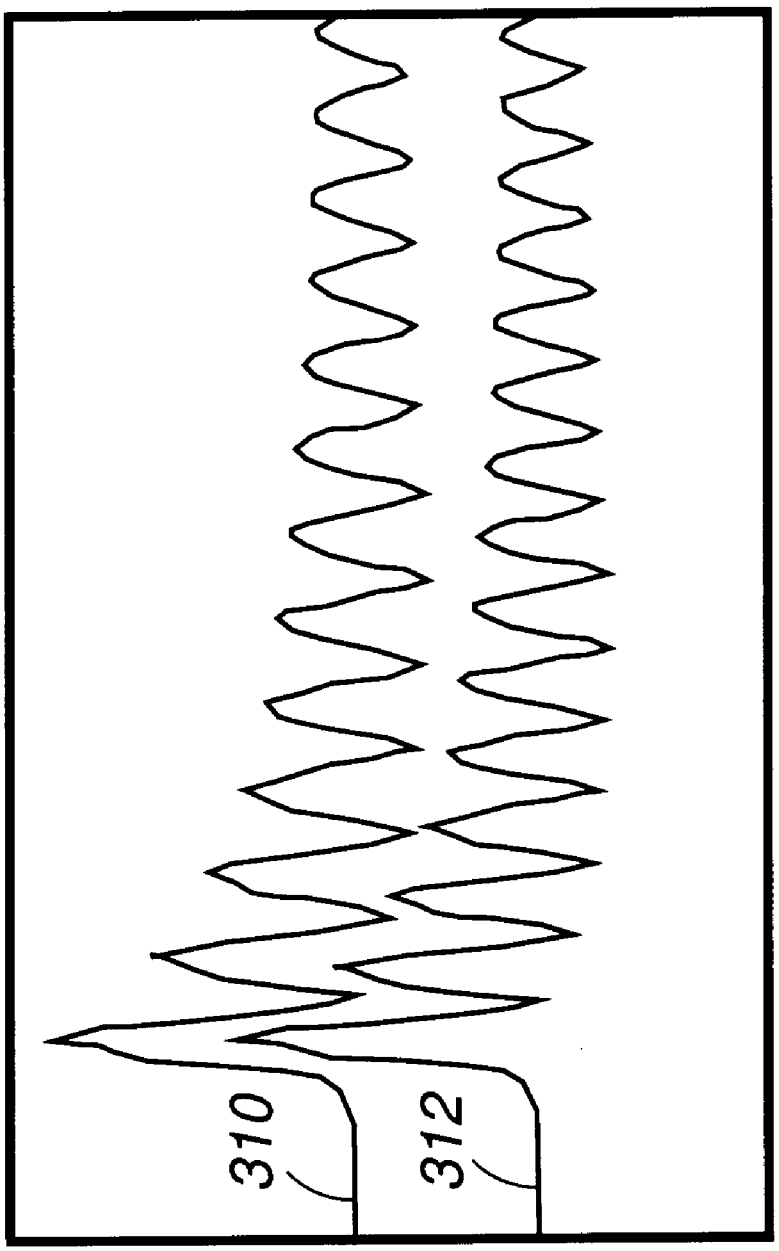
FIG. 3 is a plot of two signals generated by piezoelectric elements on two different cantilever beams.

As the cylindrical drum 102 rotates from an initial position, which will be referred to as position 1, in a clockwise direction (as viewed from the top 131 of knob 130 and as indicated by arrow 133) to the next detent, being position 2, the free end 146 of the first cantilever beam 110 is deflected/actuated by one of the protrusions 106, thereby inducing a pulse in the piezoelectric film. The dynamic excitation achieved by the deflection of the cantilevered beam 110 generates an electrical charge in the piezoelectric film which is transmitted through the beam's metalization to electronic circuitry on a controller board. In one embodiment, each pair of beams is shaped differently from the other pairs of beams, and thus have different resonant frequencies. The combination of the beam's unique resonant frequency and the piezoelectric film's properties are such that a unique signal is produced for each pair of beams. When the piezoelectric film is deflected, it produces a signal in the shape of damped sinusoidal wave forms, similar to those shown in FIG. 3. The piezoelectric element on one of the beams (110 for example) in a pair can produce a positive signal on deflection, and the other corresponding element (112 for example) can produce a negative signal. In another embodiment, each individual beam is uniquely shaped, thus providing a unique signal for each beam. Reference elements 310 and 312 show that signals produced by two different beams (110, 112, for example) are shaped differently. This is because each beam has a unique and identifiable resonant frequency. Note that the two signals 310 and 312 have different waveforms, indicating that each piezoelectric strip produces a unique, identifiable signal that can be associated with the beam that originated it.

Referring now to FIG. 4, there is shown a schematic depicting the mode of operation of the frequency domain switch. The function of this circuit is to translate the damped sinusoidal wave form generated by the piezoelectric elements into a binary code, which is then supplied to the microprocessor. only one signal line 400 is necessary to transfer the output from the piezo beams to the electronic circuit. The frequency and polarity of the damped sinusoidal wave form generated by the actuation of the piezoelectric element is sensed by the signal processor circuit 410. The specific frequency identifies which one of the eight elements was actuated and the polarity of the signal establishes the direction of the control. In a radio channel selector, for instance, the direction control could be used for a channel up or channel down command. The memory control circuit 420 converts this information to binary control signals which set or reset the individual memory circuits 430. This binary code is stored in the memory circuit cells 432 434, 436, 438, which can be Electrically Erasable Programmable Read Only Memory (EEPROM) or equivalent circuits. The memory circuits, in turn, supply the binary coded control information to the microprocessor 440. In operation, the switch actuator excites the piezoelectric elements on the cantilever beams (one per detent), which in turn produces a sinusoidal electrical wave form (similar to that shown in FIG. 3). Since the electrical wave form generated by each of the beams is unique, they can be transferred through a single connection to a designated circuit and then stored in the assigned memory cell. In this binary system only one beam is actuated per detent to increment or decrement the switch position. The following table shows the positions in which unique readable signals are sent to the memory cells, with "on" representing a positive pulse.

| SWITCH POSITION | MEMORY CELL 438 | MEMORY CELL 436 | MEMORY CELL 434 | MEMORY CELL 432 |
|---|---|---|---|---|
| 1 | off | off | off | off |
| 2 | off | off | off | on |
| 3 | off | off | on | on |
| 4 | off | off | on | off |
| 5 | off | on | on | off |
| 6 | off | on | on | on |
| 7 | off | on | off | on |
| 8 | off | on | off | off |
| 9 | on | on | off | off |
| 10 | on | on | off | on |
| 11 | on | off | off | on |
| 12 | on | off | off | off |
| 13 | on | off | on | off |
| 14 | on | on | on | off |
| 15 | on | on | on | on |
| 16 | on | off | on | on |

Assuming that the knob 130 begins a clockwise rotation from position (1) to position (2) in the table, the free end of one cantilever beam (110 for example) in the first pair (110, 112 for example) is deflected by one of the protrusions 106 and then released, inducing an electrical wave form in the piezoelectric film. This dynamic excitation generates a first positive electrical charge followed by decaying electrical wave form in the polarized film, which is transmitted through the signal line 400. This circuit recognizes the frequency of the sinusoidal wave form and sends a positive signal to the memory cell 432. The positive memory content is readable by the microprocessor 440 and labeled as "on" in the table.

By rotating the knob through the next detent to position (3), the tip of one of the cantilever beams (114 for example) in a second pair (114, 116 for example) is actuated and displaced by the corresponding protrusions. This again generates positive electrical charge followed by a decaying sinusoidal wave form. The circuit recognizes the second beam's unique decaying electrical wave form and sends a positive signal to the memory cell 434. Rotating the knob to position (4), the free end of the other cantilever beam 112 in the first pair 110, 112 is actuated and displaced by the corresponding protrusion. This generates a negative electrical charge followed by decaying sinusoidal wave form. The negative charge created by this beam erases memory cell #1. Further clockwise rotation (down in the table) of the knob will increment through the 16 switch positions and binary combinations of the four memory cells, and counter-clockwise rotation (up in the table) will decrement the binary result.

Figure 5:
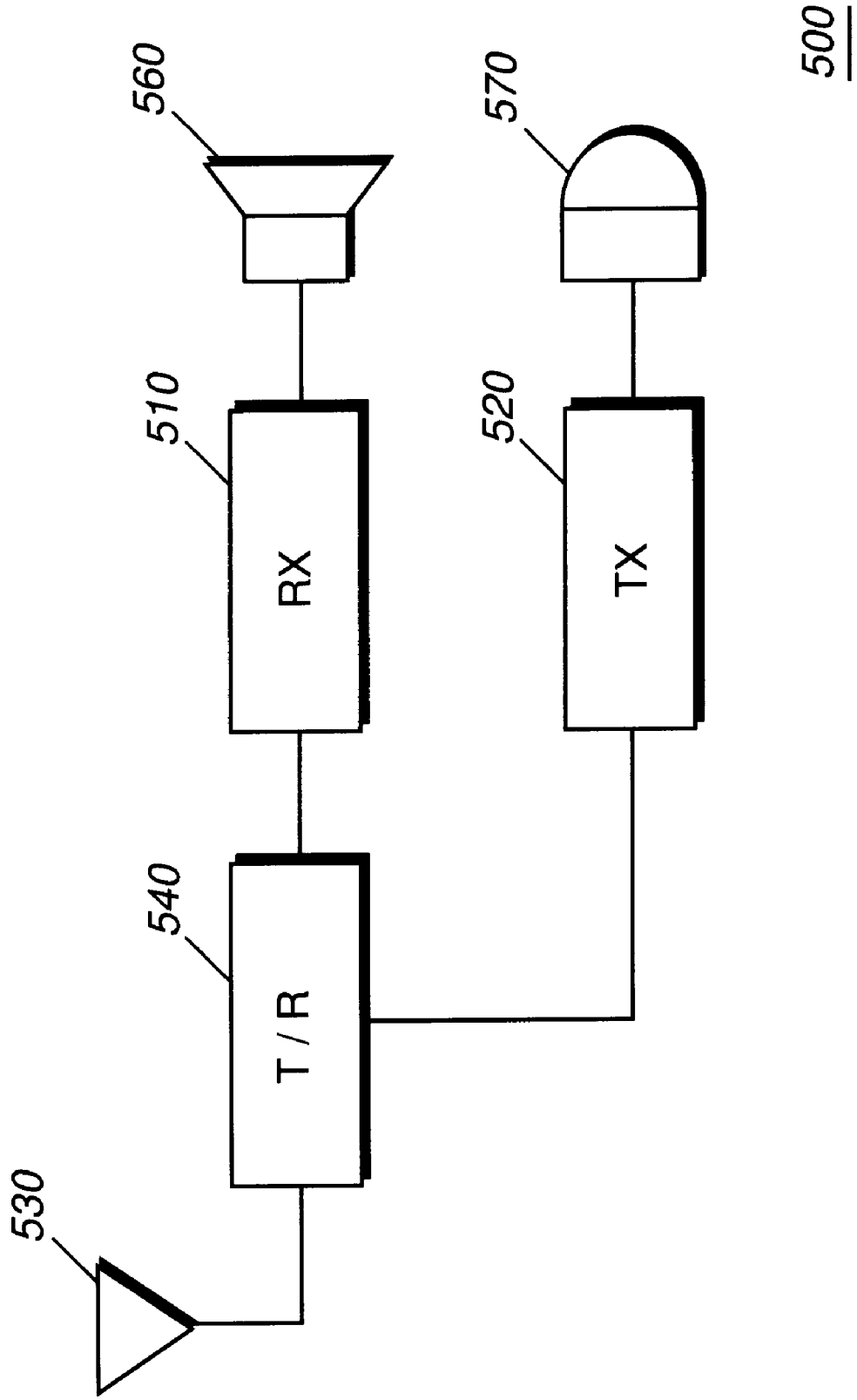
FIG. 5 is a schematic block diagram of a radio incorporating the frequency domain switch assembly described by the invention.

In a further embodiment of the invention, the frequency domain switch as described herein may find particular use in portable communications applications. Referring to FIG. 5 the present invention is utilized in a radio 500 comprising any well-known radio, such as portable two-way radios manufactured by Motorola Inc., which may operate in either receive or transmit modes. The radio 500 includes a receiver section 510 and a transmitter section 520 which comprise means for communicating, that is, transmitting or receiving communication signals for the radio.

In the receive mode, the portable radio 500 receives a communication signal via an antenna 530. A transmit/receive (T/R) switch 540 couples the received communication signal to the receiver 510. The receiver 510 receives and demodulates the received communications signal and presents its audio component to a speaker 560. It may be appreciated by one of ordinary skill in the art that other functions not herein described may be provided by any suitable means, including a controller means (not shown), which controls the entire operation of the radio 500.

In the transmit mode, audio messages are coupled from a microphone 570, where they are used to modulate a carrier signal as is well known in the art. The modulated carrier signal is then applied to the antenna 530 through the T/R switch 540 for transmission of the communication signal. It may be appreciated that the frequency domain switch, according to the principals of the present invention, may be utilized to switch between the various channels of the radio or to control the volume of the speaker.

Accordingly, there has been provided an apparatus for a frequency domain switch which provides an encoded cantilever beam system laminated with piezoelectric film which generates predefined signals which activate memory cells. The memory cells described by the invention retain their programming even after power is removed, so a radio can be turned off and on again (or even have a battery removed) and the electrical position of the switch will correlate to the knob's legend. The frequency domain switch described by the invention draws current only during activation making it ideal for use in battery powered portable radio products as well as mobile radio applications. It is applicable for use as a channel selector, volume control, on/off switch, and other controlling radio functions.

While the preferred embodiment has been described in terms of a binary coding scheme, one skilled in the art realizes that a variety of coding schemes, including but not limited to, hexadecimal coding, octal coding, and decimal coding, can be implemented. And while the invention has been described in terms of a coded cylindrical drum actuated by a rotatable knob, other mechanical actuators, such as a flat coded slider switch or plate can also be used to actuate and deflect cantilevered beams laminated with piezoelectric film. Accordingly, these and other equivalents will occur to those skilled in the art without departing from the spirit and scope of the present invention as defined by the appended claims.

What is claimed is:

1. A method of switching, utilizing an array of cantilevered beams laminated with a piezoelectric material, comprising:

providing an array of cantilevered beams, each of said beams laminated with piezoelectric film and each of said beams having a unique geometry;

deflecting a free end of one of the cantilevered beams so as to produce a sinusoidal electrical signal in the piezoelectric film, said signal being assignable only to said one of the cantilevered beams; and analyzing said signal to determine which cantilevered beam in the array of cantilevered beams has been deflected.

2. The method of switching as described in claim 1, wherein the step of deflecting comprises deflecting the beam by a protrusion on a cylindrical drum.

3. The method of switching as described in claim 2, wherein the cylindrical drum turns in response to rotations of a rotatable knob.

4. The method of switching as described in claim 3, wherein the sinusoidal electrical signal is associated with the position of the rotatable knob.

5. The method of switching as described in claim 4, wherein the step of analyzing further comprises:

identifying which of the beams was deflected;

determining the polarity of the signal;

converting the sinusoidal signal to a coded signal;

storing the coded signal in a memory circuit comprising a memory cell for each two opposing cantilevered beams, the memory cell storing the sinusoidal signal associated with the position of the knob; and reading the memory circuit by a microprocessor.

6. The method of switching as described in claim 1, wherein the step of analyzing further comprises:

identifying which of the beams was deflected;

determining the polarity of the signal;

converting the sinusoidal signal to a binary coded signal;

storing the binary coded signal in a memory circuit; and reading the memory circuit by a microprocessor.

7. The method of switching as described in claim 1, wherein one of the cantilevered beams provides a positive electrical signal when deflected, and another of the cantilevered beam provides a negative electrical signal when deflected.

8. The method of switching as described in claim 1, wherein the array of cantilevered beams represents a predetermined coding scheme.

9. The method of switching as described in claim 1, wherein the piezoelectric material is a polymer film.

10. The method of switching as described in claim 1, wherein the piezoelectric material is ceramic.

11. A method of switching channels in a radio, comprising:

providing a switch having two or more cantilevered beams, each of said beams laminated with piezoelectric film and each of said beams having a unique geometry;

actuating the switch sufficient to produce a deflection in a free end of one of the cantilevered beams;

said deflection producing a sinusoidal electrical signal in the piezoelectric film, said signal being assignable only to said one of the cantilevered beams;

analyzing said signal to determine which cantilevered beam has been deflected; and switching said radio to a selected channel in response to said analyzed signal.

* * * * *